United States Patent
Tanabe et al.

(10) Patent No.: US 6,743,653 B2
(45) Date of Patent: Jun. 1, 2004

(54) MICROMACHINE MANUFACTURING METHOD

(75) Inventors: Yasuyuki Tanabe, Kanagawa (JP); Katsuyuki Machida, Kanagawa (JP); Hiromu Ishii, Kanagawa (JP); Shouji Yagi, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 10/434,761

(22) Filed: May 8, 2003

(65) Prior Publication Data

US 2004/0072386 A1 Apr. 15, 2004

(30) Foreign Application Priority Data

Oct. 10, 2002 (JP) ........................................ 2002-297828
May 8, 2003 (JP) ........................................ 2002-132900

(51) Int. Cl.⁷ ................................................ H01L 21/00
(52) U.S. Cl. ............................................ 438/48; 438/53
(58) Field of Search ................................ 438/48–53, 29, 438/7–9

(56) References Cited

U.S. PATENT DOCUMENTS

2002/0142508 A1 * 10/2002 Munch ........................ 438/51

FOREIGN PATENT DOCUMENTS

| JP | 11-119123 A | 4/1999 |
| JP | 2000-121966 A | 4/2000 |
| JP | 2001-198897 A | 7/2001 |
| JP | 2002-189178 A | 7/2002 |

OTHER PUBLICATIONS

Sawada et al., "Single Crystalline mirror Actuated Electrostatically by Terraced Electrodes With High–Aspect Ratio Torsion Spring", Optical MEMS 2001, pp 23 24 (Okinawa Japan).
Sawada et al., "Single Si Crystal 1024ch MEMS Mirror Based on Terraced Electrodes and a High–Aspect Ratio Torsion Spirng for 3–D Cross–Connect Switch", Optical MEMS 2002, pp. 11–12 (Lugano Switzerland).
Juan et al., "High–Aspect–Radio Si Vertical Micromirror Arrays for Optical Switching", Journal of Microelectromechanical Systems, vol. 7, No. 2, pp. 207–213 (Jun. 1998).
Li et al., "MEMS Optical Switches", Lasers aned Electro–Optics Society, the 14$^{th}$ Annual Meeting of the IEEE, vol. 1, pp. 10–11 (2001).

(List continued on next page.)

Primary Examiner—H. Jey Tsai
(74) Attorney, Agent, or Firm—Blakely, Sokoloff, Taylor & Zafman

(57) ABSTRACT

A micromachine manufacturing method according to this invention includes at least the movable portion formation step of selectively etching a single-crystal silicon layer by using a movable portion formation mask pattern as a mask, thereby forming on the single-crystal silicon layer a movable portion which is coupled to the surrounding single-crystal silicon layer via a coupling portion on a buried oxide, the movable portion protective film formation step of forming a movable portion protective film on the single-crystal silicon layer so as to cover the movable portion while the movable portion is formed on the buried oxide, and the step of forming a buried protective film which covers the movable portion exposed in the substrate opening and movable portion opening, and the single-crystal silicon layer around the movable portion while the movable portion protective film is formed.

13 Claims, 12 Drawing Sheets

OTHER PUBLICATIONS

Feather et al., "The Digital Micromirror Device for Projection Display", Wafer Scale Integration Proceedings, $7^{th}$ Annual IEEE International Conference, pp. 43–51 (Jan. 18–20, 1995).

Ji et al., "Design and Fabrication of Electromagnetic Micromirror With Bulk Silicon Mirror Plate and Aluminum Spring", Optical MEMS 2002, IEEE/LEOS International Conference, pp. 97–98.

Kato et al., "Development of 4x4 MEMS Optical Switch", Optical MEMS 2000, IEEE./LEOS International Conference, pp. 95–96.

Jin et al., "An SOI Optical Microswitch Integrated With Silicon Waveguides and Touch–Down Micromirror Actuators", Optical MEMS 2000, IEEE/LEOS International Conference, pp. 43–44.

Milanovich, "Multilevel Beam SOI–MEMS Fabrication and Applications", Electronics, Circuits and Systems, $9^{th}$ International Conference, vol. 1, pp. 281–285 (2002).

Uenishi et al., "Free–Space Optical Cross Connect Switch Based on A 3D MEMS Mirror Array", Lasers and Electro–Optics Society, The $15^{th}$ Annual Meeting of the IEEE, vol. 1, pp. 59–60 (2002).

Liu, et al., "The Sacrificial Layer Releasing of Micro–Machined Optical–Fiber Switch With Poly–si Torsion Mirror", Solid–State and Integrated–Circuit Technology Proceedings, $6^{th}$ International Conference, vol. 2, pp. 827–830 (2001).

Yeow et al., "Micromachined L–Switching Matrix", Communications, ICC 2002, IEEE International Conference, vol. 5, pp. 2848–2854.

Bishop et al., "The Lucent LambdaRouter MEMS Technology of The Future Here Today", IEEE Communications Magazine, vol. 40, Issue 3, pp. 75–79, (Mar. 2002).

Chu et al., "MEMS: The Path to Large Optical Crossconnects", IEEE Communications Magazine, vol. 40, Issue 3, pp. 80–87 (Mar. 2002).

Dobbelaere et al., "Digital MEMS for Optical Switching", IEEE Communications Magazine, vol. 40, Issue 3, pp. 88–95, (Mar. 2002).

Peter et al., "Optical MEMS for Adaptive Optics Applications", Electrochemical Society Proceedings, vol. 2002–4, pp. 361–380.

* cited by examiner

MICROMACHINE MANUFACTURING METHOD

BACKGROUND OF THE INVENTION

The present invention relates to a method of manufacturing a micromachine such as an optical switching element used for communication, measurement, display, and the like which utilize switching.

There is a MEMS element which is fabricated by a micromachine technique of performing three-dimensional micropatterning by etching based on thin film formation or photolithography. Of MEMS elements serving as micromachines, one is comprised of a fine fixed structure and movable structure, and controls the operation of the movable structure by an electrical signal. Such MEMS element is an optical switching element whose movable structure has a reflecting surface (reference 1: Japanese Patent Laid-Open No. 2001-198897, reference 2: Japanese Patent Laid-Open No. 2002-189178, reference 3: Japanese Patent Laid-Open No. 11-119123, reference 4: "MEMS Micro Technology, Mega Impact" Circuit & Device, pp. 14–25 (2001), reference 5: Renshi Sawada, Eiji Higurashi, Akira Shimizu, and Tohru Maruno, "Single Crystalline Mirror Actuated Electrostatically by Terraced Electrodes With High-Aspect Ratio Torsion Spring," Optical MEMS 2001, pp. 23–24 (Okinawa Japan), 2001, and reference 6: Renshi Sawada, Johji Yamaguchi, Eiji Higurashi, Akira Shimizu, Tsuyoshi Yamamoto, Nobuyuki Takeuchi, and Yuji Uenishi, "Single Si Crystal 1024ch MEMS Mirror Based on Terraced Electrodes and a High-Aspect Ratio Torsion Spring for 3-D Cross-Connect Switch," Optical MEMS 2002, pp. 11–12 (Lugano Switzerland), 2002).

The optical switching device is comprised of, e.g., a fixed structure and movable reflecting structure. The reflecting structure has a support member and movable member, and the movable member is coupled to the support member by a spring member such as a torsion spring. The optical switch with this arrangement performs switching operation of switching the optical path by moving the reflecting structure by the attractive force or repulsive force between the fixed structure and the movable reflecting structure.

As an optical switching element manufacturing method, a method using an SOI (Silicon On Insulator) substrate is proposed. A process of fabricating a mirror (movable portion) by this method will be explained. As shown in FIG. 4A, grooves 401a are formed by known photolithography and etching such as DEEP RIE on a side (major surface: SOI layer) of an SOI substrate 401 on which a buried oxide 402 is formed, thereby forming a mirror 404 from a single-crystal silicon layer 403 on the buried oxide 402.

In DEEP RIE, for example, $SF_6$ gas and $C_4F_8$ gas are alternately introduced in dry-etching silicon. Etching and formation of a side wall protective film are repeated to form a groove or hole with an aspect ratio of 50 at an etching rate of several $\mu$m/min.

A resist pattern which is open In the formation region of the mirror 404 is formed on the lower surface of the SOI substrate 401. Silicon is selectively etched from the lower surface of the SOI substrate 401 by using an etching solution such as an aqueous solution of potassium hydroxide. In etching, the buried oxide 402 is used as an etching stopper layer. As shown in FIG. 4B, an opening 401b is formed at a portion of the lower surface of the SOI substrate 401 that corresponds to the formation region of the mirror 404. The opening 401b is a region corresponding to the pixel of the optical switching element.

The region where the buried oxide 402 is exposed through the opening 401b is selectively removed with hydrofluoric acid, forming the pivotal mirror 404 supported by the SOI substrate 401, as shown in FIG. 4C. To increase the reflectance of the mirror 404, a metal film of gold or the like may be formed on the surface of the mirror 404 on the opening 401b side.

A silicon substrate 411 is selectively etched with an aqueous solution of potassium hydroxide by using as a mask a predetermined mask pattern formed from a silicon nitride film or silicon oxide film, thus forming a recessed structure, as shown in FIG. 4D. A metal film is formed on the recessed structure by vapor deposition or the like. The metal film is patterned by photolithography and etching using known ultra-deep exposure, thereby forming an electrode 412 including a mirror driving electrode interconnection and the like, as shown in FIG. 4E.

After that, the SOI substrate 401 and silicon substrate 411 are diced into chips, thus forming a mirror chip and electrode chip. The mirror chip and electrode chip are adhered into an optical switching element in which the mirror 404 can be moved by applying an electric field, as shown in FIG. 4F. After each chip is diced, a metal film of gold or the like may be formed on the mirror surface in order to increase the mirror reflectance.

In a step after etching a buried oxide according to the conventional manufacturing method, the mirror portion is coupled by a pair of coupling members so as to be pivotal on a pivot shaft which extends through the coupling members. The coupling members are bar- or plate-like spring members such as torsion bar springs which elastically deform upon application of torsion.

For example, while being coupled by torsion bar springs, the mirror undergoes a wafer dry step after etching a buried oxide with a buffered hydrofluoric acid solution and cleaning the buried oxide with water, a wafer dicing step, a step of forming a metal film on a diced mirror surface, a step of adhering a mirror chip to a substrate bearing a mirror driving electrode interconnection, a step of bonding a die to a package, a wire bonding step, a potting step, and the like.

The optical switching element applies an attractive force to the mirror by an electric field generated by a voltage applied to the mirror driving electrode, and pivots the mirror through an angle of several degrees. For reduction in power consumption and the like, the mirror must be pivoted by applying a voltage of about 100 V to the mirror driving electrode. Thus, the coupling member is processed into a width of about 2 $\mu$m so as to easily pivot the mirror.

Since the SOI layer is about 10 $\mu$m thick, the coupling member is about 2 $\mu$m wide and 10 $\mu$m thick. For example, as shown in FIG. 5, a circular mirror 501 having a diameter of about 500 $\mu$m is coupled to a surrounding concentric mirror frame 502 via thin coupling members 511 having a width of about 2 $\mu$m. The mirror frame 502 is coupled to an SOI layer 503 via coupling members 512.

In the above-mentioned steps, a water flow, a centrifugal force in drying a wafer, vibrations, or shocks are applied. This readily damages a coupling member or mirror, decreasing the manufacturing yield of the mirror substrate. Especially when even one mirror becomes defective on a mirror substrate on which many mirrors are arrayed in a matrix, the mirror substrate becomes a defective and cannot be used, resulting in a lower yield.

When a mirror substrate wafer is transported as a wafer or diced chip after the manufacture, the wafer or chip itself is protected by a vessel which stores it. However, a mirror and mirror frame which are coupled by thin coupling members are movable and vulnerable to the centrifugal force, vibrations, and shocks. The manufacturing yield of the mirror substrate may further decrease.

The manufacture of an optical switching element mirror substrate is completed when a mirror surface which reflects incident light is exposed. In dicing into a chip, small wafer shaving powder is attached to the mirror surface via the gap of the coupling member or the like. Dust is attached in safekeeping or handling till packaging, decreasing the optical reflectance.

SUMMARY OF THE INVENTION

It is a principal object of the present invention to manufacture a micromachine having a movable portion such as a mirror at a high nondefective yield.

To achieve the above object, according to one aspect of the present invention, there is provided a micromachine manufacturing method comprising at least the step of preparing a silicon substrate having a single-crystal silicon layer on an upper surface via a buried oxide, the movable portion formation step of selectively etching the single-crystal silicon layer by using a movable portion formation mask pattern as a mask, thereby forming on the single-crystal silicon layer a movable portion which is coupled to the surrounding single-crystal silicon layer via a coupling portion on the buried oxide, the frame formation step of selectively etching away the silicon substrate from a lower surface by using as a mask a frame formation mask pattern having an opening, thereby forming a substrate opening in the silicon substrate and exposing a lower surface of the buried oxide in the substrate opening, the movable portion protective film formation step of forming a movable portion protective film on the single-crystal silicon layer so as to cover the movable portion while the movable portion is formed on the buried oxide, the buried oxide processing step of forming in a movable portion formation region of the buried oxide a movable portion opening which communicates with the substrate opening while the movable portion protective film is formed, and the step of forming a buried protective film which covers the movable portion exposed in the substrate opening and the movable portion opening, and the single-crystal silicon layer around the movable portion while the movable portion protective film is formed.

With this arrangement, the movable portion formed in the single-crystal silicon layer is kept fixed by bringing some layer or film into contact with the movable portion until the buried protective film is formed.

BRIEF DESCRIPTION OF THE DRAWINGS

FIGS. 4A to 4F are schematic sectional views showing steps for explaining a conventional micromachine manufacturing method.

DESCRIPTION OF THE PREFERRED EMBODIMENTS

Preferred embodiments of the present invention will be described in detail below with reference to the accompanying drawings.

First Embodiment

The first embodiment of the present invention will be described. FIGS. 1A to 1L show an example of a manufacturing method according to the first embodiment.

Figure 1A:
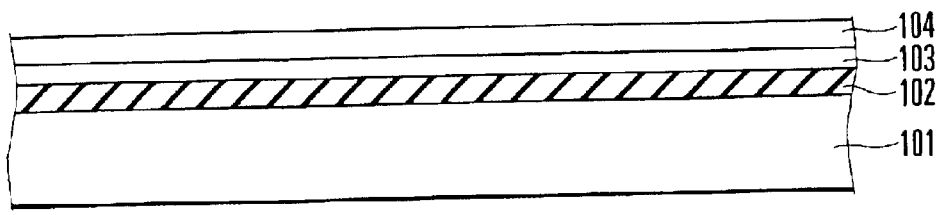
FIGS. 1A to 1L are schematic sectional views showing steps for explaining a manufacturing method according to the first embodiment of the present invention.

As shown in FIG. 1A, an SOI substrate obtained by forming a 1-$\mu$m thick buried silicon oxide 102 and a 10-$\mu$m thick single-crystal silicon layer (SOI layer) 103 on a silicon substrate 101 having a (100) plane is prepared.

A protective film (upper surface protective film) 104 is formed from, e.g., a positive photoresist material on the SOI layer 103 side (to be referred to as an upper surface side hereinafter). Instead of the photoresist material, polyimide or a photosensitive organic resin such as polybenzoxazole may be applied to form the protective film 104. By forming the protective film 104, the upper surface of the SOI layer 103 is protected in subsequent steps.

Figure 1B:
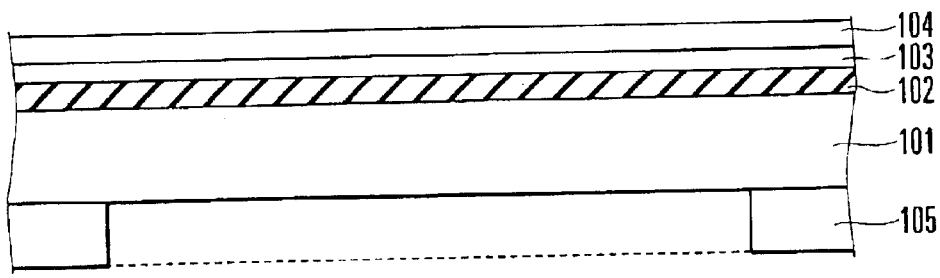

As shown in FIG. 1B, a mask pattern (frame formation mask pattern) 105 is formed on the lower surface of the silicon substrate 101. The mask pattern 105 is a pattern corresponding to the pixel (or chip region) of an optical switching device, and has an open square region for each mirror. FIGS. 1A to 1L show only part of the region on the silicon substrate 101. For example, part of the region of a mirror substrate having one mirror chip with a plurality of pixels arrayed in a matrix is illustrated. Note that a mirror chip may be formed from a portion having one mirror.

Figure 1C:
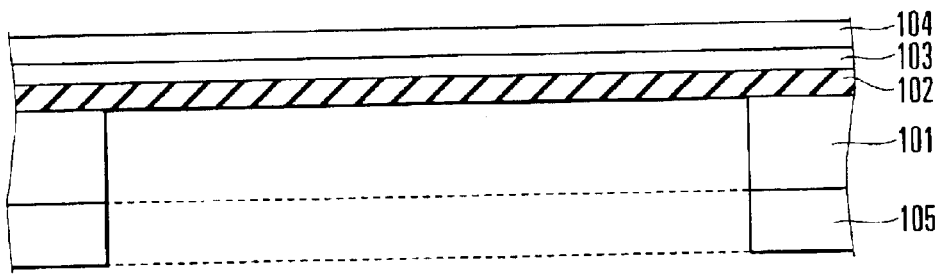

As shown in FIG. 1C, the silicon substrate 101 is etched by anisotropic etching using the mask pattern 105 as a mask until the buried oxide 102 is exposed, thereby forming an opening in the substrate. In etching processing, the SOI layer 103 is not etched and is protected because the protective film 104 is formed, as described above.

Figure 1D:
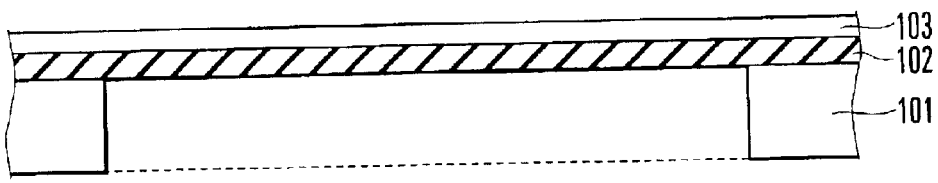

The protective film 104 and mask pattern 105 are ashed away, exposing the upper surface of the SOI layer 103, as shown in FIG. 1D. In this state the opening is kept formed in the silicon substrate 101 in the mirror formation region. The lower surface of the SOI layer 103 is covered and protected by the buried oxide 102.

Figure 1E:
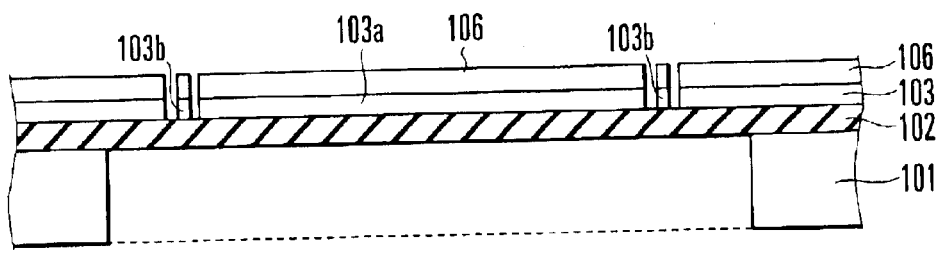

As shown in FIG. 1E, a mask pattern (movable portion formation mask pattern) 106 is formed on the SOI layer 103, and the SOI layer 103 is etched using the mask pattern 106 as a mask. This etching is anisotropic etching such as reactive ion etching, and the upper surface of the buried oxide 102 is exposed at etching portions. By etching, a mirror 103a, and torsion bar springs (coupling portions) 103b simply shown in FIG. 1E are formed.

At this time, a pattern for forming a scribe line serving as a guide in dicing is formed in a region (not shown) of the mask pattern 106. A scribe line is simultaneously formed in a region (not shown) of the SOI layer 103.

In this manner, according to the first embodiment, the mirror 103a is formed after an opening is formed in the silicon substrate 101. In forming the mirror 103a, a region where the mirror 103a is to be formed becomes thin. In photolithography for forming the mirror 103a, the position of the opening formed from the lower surface side of the silicon substrate 101 can be confirmed even from the upper surface side of the SOI layer 103. The first embodiment can eliminate the need for a double-side aligner mechanism.

Figure 1F:
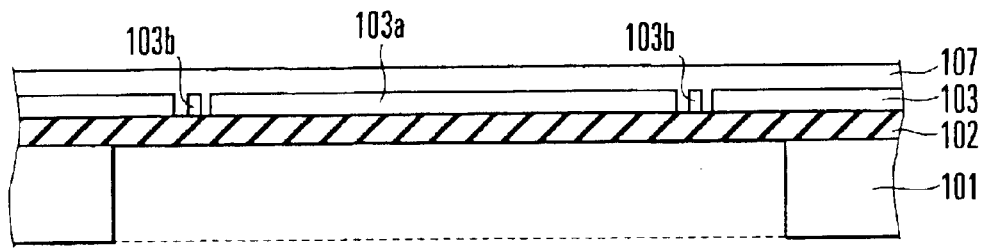

The mask pattern 106 is ashed away, and then a protective film (movable portion protective film) 107 is formed from an organic material so as to cover the SOI layer 103 having a plurality of mirrors 103a and a plurality of torsion bar springs 103b, as shown in FIG. 1F. The protective film 107 suffices to be made of a positive photoresist material, polyimide, or a photosensitive organic resin such as polybenzoxazole.

Figure 1G:
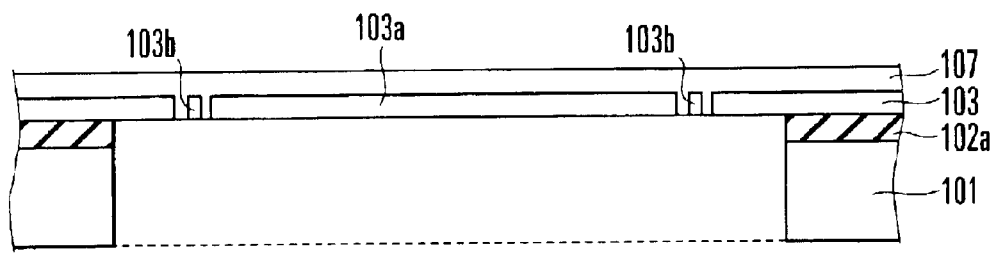

The buried oxide 102 which is exposed in the opening region of the silicon substrate 101 is etched away with a buffered hydrofluoric acid solution. As a result, as shown in FIG. 1G, a buried oxide 102a having a through opening is formed on the silicon substrate 101 having the opening so as to sandwich the buried oxide 102a between the silicon substrate 101 and the SOI layer 103.

After that, part of the protective film 107 which is exposed in the opening of the silicon substrate 101 at separation portions such as the torsion bar springs 103b is removed, forming gaps (grooves) between the torsion bar springs 103b, and the mirror 103a and SOI layer 103 by about 8 μm in the direction of depth. The grooves are about 2 μm wide, and the formed open portions are grooves which are about 2 μm wide and 8 μm deep. At this time, the lower surface of the SOI layer 103 is exposed in the opening of the silicon substrate 101. The upper surface of the SOI layer 103 is covered with the protective film 107, and the mirror 103a is fixed.

Figure 1H:
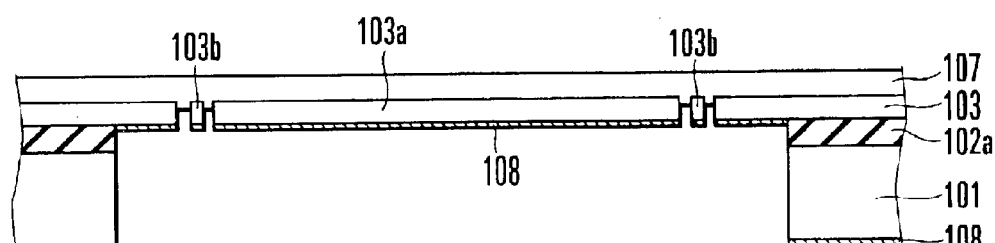

As shown in FIG. 1H, an Au/Ti metal film (reflecting metal film) 108 is formed by sputtering or vapor deposition on the lower surface of the SOI layer 103 including the mirror 103a exposed in the opening of the silicon substrate 101. The metal film 108 is comprised of a lower (SOI layer 103 side) titanium film having a film thickness of about 0.05 μm and an upper Au film having a film thickness of about 0.05 μm. The metal film 108 is also formed on the lower surface of the silicon substrate 101.

A protective film (buried protective film) 109 is formed from an organic material such as a positive photoresist material so as to cover the lower surface of the silicon substrate 101 on which the metal film 108 is formed, in addition to the formation surface of the metal film 108 which is formed on the silicon substrate 101 within the opening. Instead of the photoresist material, polyimide or a photosensitive organic resin such as polybenzoxazole may be applied to form the protective film 109.

Figure 1I:
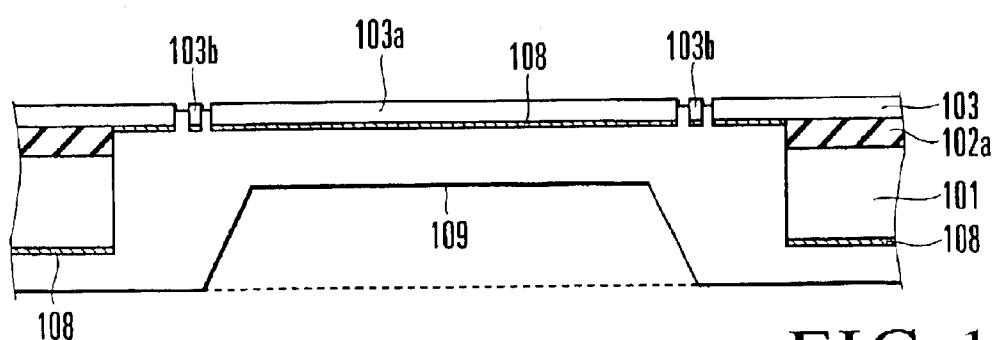

The protective film 107 on the upper surface of the SOI layer 103 is ashed away, exposing the upper surface of the SOI layer 103, as shown in FIG. 1I. At this time, the mirror 103a is fixed because the protective film 109 covers the lower surface of the SOI layer 103 including the mirror 103a covered with the metal film 108 on the opening side of the silicon substrate 101.

Part of the protective film 109 which is exposed on the upper surface of the SOI layer 103 at separation portions such as the torsion bar springs 103b is removed, forming gaps (grooves) between the torsion bar springs 103b, and the mirror 103a and SOI layer 103 by about 8 μm in the direction of depth. The grooves are about 2 μm wide, and the open portions formed on the upper surface of the SOI layer 103 are grooves which are about 2 μm wide and 8 μm deep.

Figure 1J:
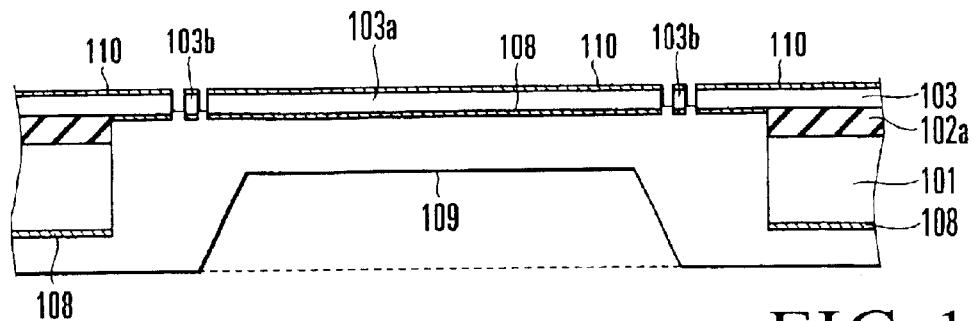

As shown in FIG. 1J, an Au/Ti metal film (connection metal film) 110 is formed by sputtering or vapor deposition on the upper surface of the SOI layer 103. The metal film 110 is comprised of a lower titanium film having a film thickness of about 0.05 μm and an upper Au film having a film thickness of about 0.05 μm.

The metal film 108 formed on the lower surface of the SOI layer 103 compensates for the reflectance of the mirror 103a. The metal film 110 formed on the upper surface of the SOI layer 103 functions as a conductive metal film for electrically connecting at a low resistance the mirror substrate and the connection electrode of a mirror driving electrode substrate when the mirror substrate and the substrate having a mirror driving electrode interconnection are adhered into an optical switching device.

By processing the SOI layer 103, a plurality of mirrors 103a which are coupled by the torsion bar springs 103b are formed in a plurality of opening regions (not shown) formed in the SOI layer 103. The metal films 108 and 110 are formed on the two surfaces of the SOI layer 103.

Figure 1K:
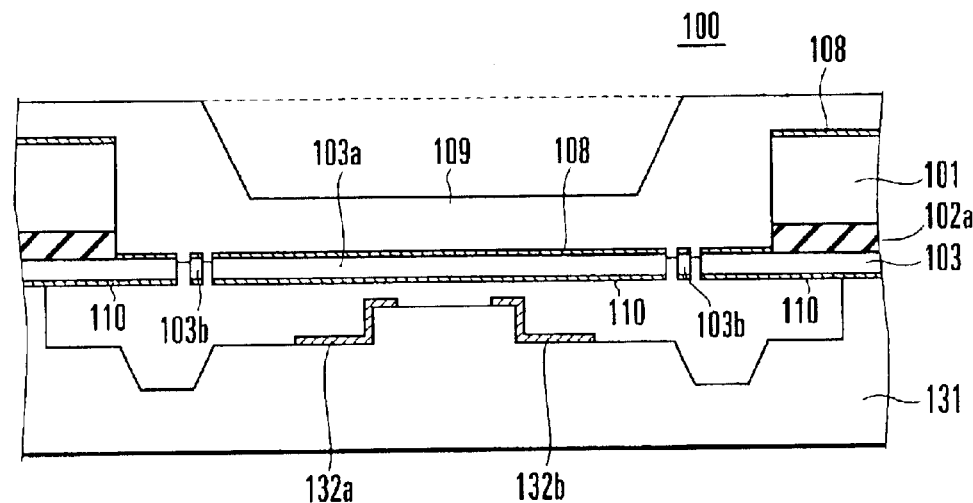

In the dicing step, the silicon substrate 101 is diced, and a mirror substrate 100 which is diced into chips is adhered to a substrate 131, as shown in FIG. 1K. FIG. 1K shows one of a plurality of mirrors formed on the chip. A mirror driving electrode interconnection is formed on the substrate 131, and mirror driving electrodes 132a and 132b are connected to the interconnection.

Figure 1L:
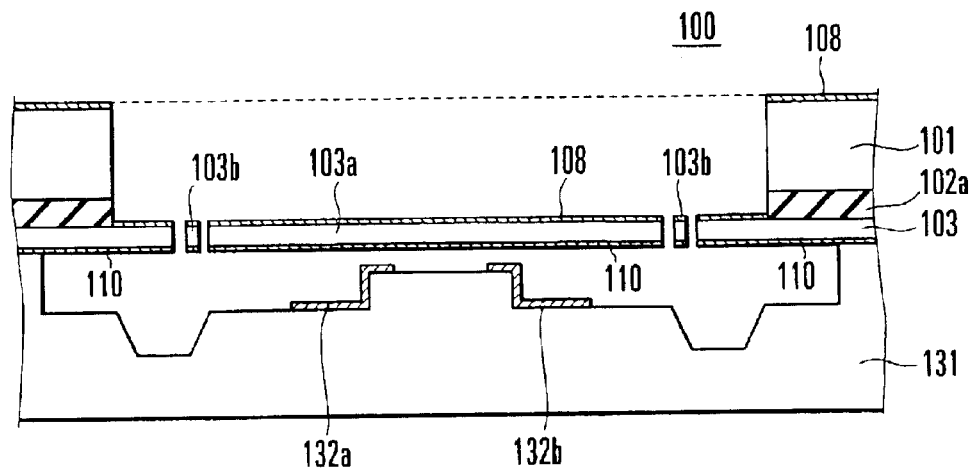

The substrate 131 which is adhered to the mirror substrate 100 is die-bonded to a package (not shown), and necessary terminals are wired in the wire bonding step. After the potting step, the protective film 109 which covers the mirror substrate 100 is removed with an organic solvent such as acetone, completing packaging of the optical switching device mirror substrate having the movable mirror 103a, as shown in FIG. 1L.

The first embodiment eliminates the need for an apparatus such as a double-side aligner mechanism. According to the first embodiment, one or two surfaces of an SOI layer on which a mirror serving as a movable portion and a torsion bar spring are formed are always covered with an oxide film, protective film, or the like, and the mirror and torsion bar spring are kept fixed. According to the first embodiment, damage to the mirror and torsion bar spring during the process can be prevented, attachment of dust to the mirror surface can be suppressed, and a mirror substrate for an optical switching device serving as a micromachine can be manufactured and packaged at a high yield. Further, the first embodiment hardly increases the number of steps.

Second Embodiment

Figure 2A:
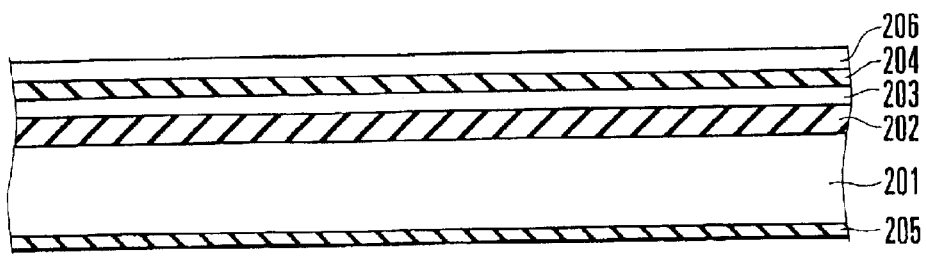
FIGS. 2A to 2N are schematic sectional views showing steps for explaining a manufacturing method according to the second embodiment of the present invention.

The second embodiment of the present invention will be described. FIGS. 2A to 2N show an example of a manufacturing method according to the second embodiment.

As shown in FIG. 2A, an SOI substrate obtained by forming a 1-μm thick buried oxide 202 and a 10-μm thick single-crystal silicon layer (SOI layer) 203 on a silicon substrate 201 having a (100) plane is prepared.

The SOI layer 203 and silicon substrate 201 are oxidized to form an $SiO_2$ insulating film (first insulating film) 204 on the upper surface of the SOI layer 203 and an $SiO_2$ insulating film (second insulating film) 205 on the lower surface of the silicon substrate 201. In addition, a protective film 206 is formed from, e.g., a positive photoresist material on the insulating film 204. Instead of the photoresist material, polyimide or a photosensitive organic resin such as polybenzoxazole may be applied to form the protective film 206.

Figure 2B:
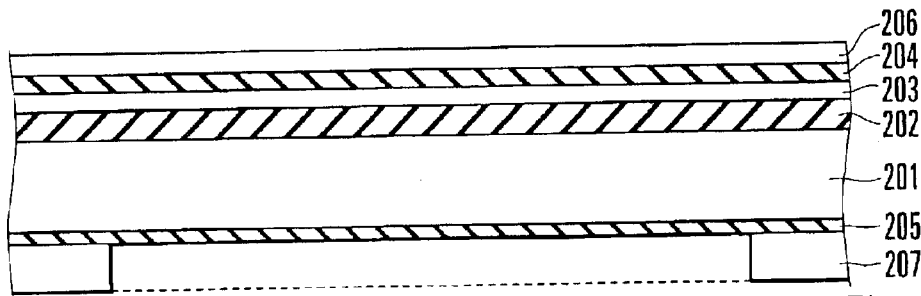
Figure 2C:
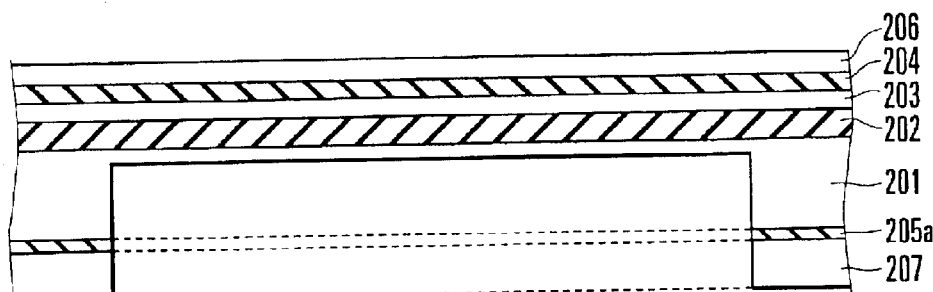
Figure 2D:
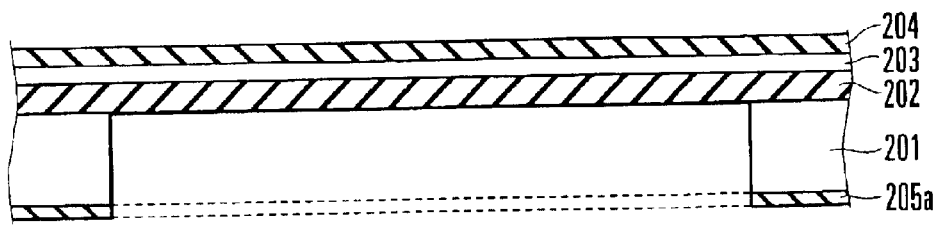
Figure 2E:
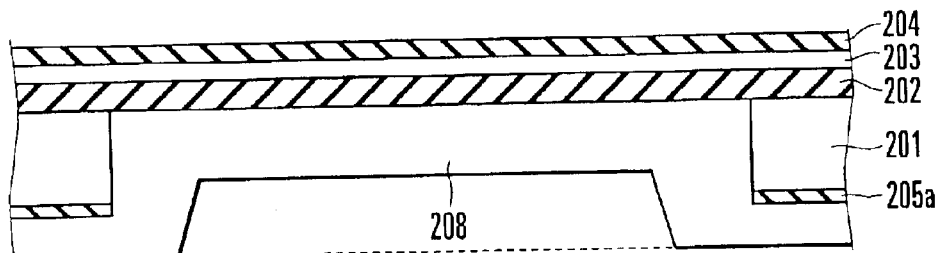

As shown in FIG. 2B, a mask pattern (frame formation mask pattern) 207 is formed on the insulating film 205 on the lower surface of the silicon substrate 201. The mask pattern 207 is a pattern corresponding to the pixel (or chip region) of an optical switching device, and has an open square region for each mirror. FIGS. 2A to 2N show only part of the region on the silicon substrate 101, and illustrate a square region which is cut out from the silicon substrate 201 and serves as one pixel on the mirror substrate.

The insulating film 205 is selectively removed using the mask pattern 207 as a mask by anisotropic etching such as reactive ion etching or wet etching with buffered hydrofluoric acid. The lower surface of the silicon substrate 201 is selectively removed by anisotropic etching such as reactive ion etching. As a result, as shown in FIG. 2C, an insulating film 205a having a through opening is formed on the lower surface of the silicon substrate 201 having an opening. In etching, the silicon substrate 201 is left to a given degree (e.g., about 300 μm) so as not to expose the buried oxide 202. The remaining silicon substrate 201 can suppress damage to the SOI layer 203 via the buried oxide 202 by the above-mentioned etching.

The mask pattern 207 is ashed away, and the lower surface of the silicon substrate 201 left in the opening is removed by wet etching using the insulating film 205a as a mask with an aqueous solution of potassium hydroxide. As shown in FIG. 2D, the lower surface of the buried oxide 202 is exposed to form a substrate opening. At this time, the positive photoresist protective film 206 is also dissolved away in the aqueous solution of potassium hydroxide. shown in FIG. 2E, a lower surface protective film 208 is formed from an organic material such as a positive photoresist material so as to cover the lower surface of the silicon substrate 201 including the lower surface of the buried oxide 202 within the opening formed in the silicon substrate 201.

Figure 2F:
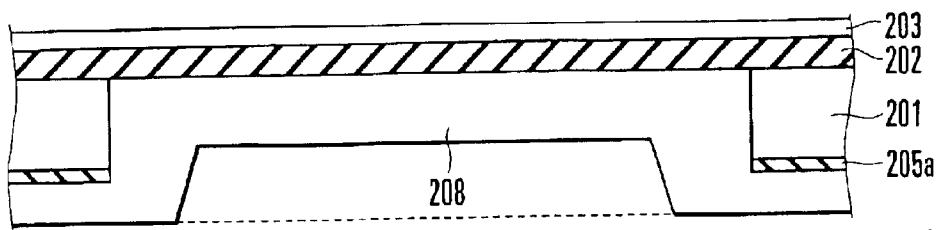

The insulating film 204 on the SOI layer 203 is removed by wet etching with a buffered hydrofluoric acid solution, exposing the upper surface of the SOI layer 203, as shown in FIG. 2F. In etching processing, the buried oxide 202 is covered with the lower surface protective film 208, and is not etched with a buffered hydrofluoric acid solution.

Figure 2G:
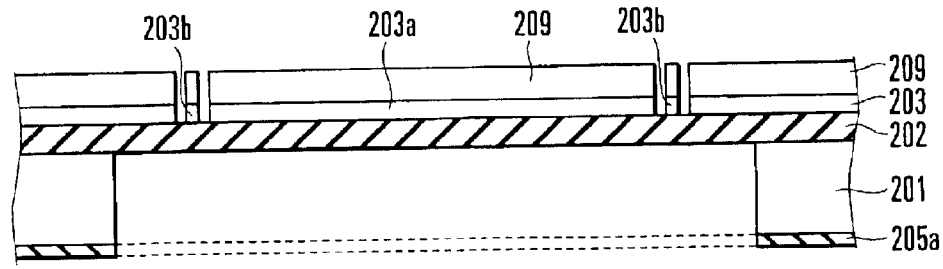

The lower surface protective film 208 is removed, and a mask pattern (movable portion formation mask pattern) 209 is formed on the SOI layer 203, as shown in FIG. 2G. The SOI layer 203 is etched using the mask pattern 209 as a mask. This etching is anisotropic etching such as reactive ion etching, and the upper surface of the buried oxide 202 is exposed at etching portions. By etching, a mirror 203a, and torsion bar springs 203b simply shown in FIG. 2G are formed.

At this time, a pattern for forming a scribe line serving as a guide in dicing is formed in a region (not shown) of the mask pattern 209. A scribe line is simultaneously formed in a region (not shown) of the SOI layer 203.

As described above, according to the second embodiment, the mirror 203a is formed after an opening is formed in the silicon substrate 201. In forming the mirror 203a, a region where the mirror 203a is to be formed becomes thin. In photolithography for forming the mirror 203a, the position of the opening formed from the lower surface side of the silicon substrate 201 can be confirmed even from the upper surface side of the SOI layer 203. The second embodiment can eliminate the need for a double-side aligner mechanism.

Figure 2H:
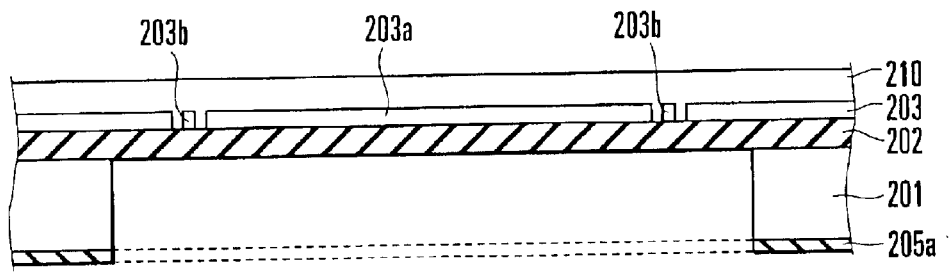

The mask pattern 209 is ashed away, and then a protective film (movable portion protective film) 210 is formed from an organic material so as to cover the SOI layer 203 having a plurality of mirrors 203a and a plurality of torsion bar springs 203b, as shown in FIG. 2H. The protective film 210 suffices to be made of a positive photoresist material, polyimide, or a photosensitive organic resin such as polybenzoxazole.

Figure 2I:
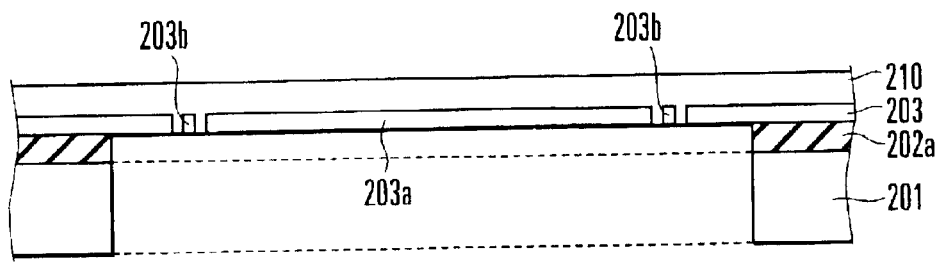

The buried oxide 202 which is exposed in the opening of the silicon substrate 201 is etched away with a buffered hydrofluoric acid solution. At the same time, the insulating film 205a on the lower surface of the silicon substrate 201 is removed. As a result, as shown in FIG. 2I, a buried oxide 202a having a through opening is formed on the silicon substrate 201 having the opening so as to sandwich the buried oxide 202a between the silicon substrate 201 and the SOI layer 203.

Thereafter, part of the protective film 210 which is exposed in the opening of the silicon substrate 201 at separation portions such as the torsion bar springs 203b is removed, forming gaps (grooves) between the torsion bar springs 203b, and the mirror 203a and SOI layer 203 by about 8 μm in the direction of depth. The grooves are about 2 μm wide, and the formed open portions are grooves which are about 2 μm wide and 8 μm deep. At this time, the lower surface of the SOI layer 203 is exposed in the opening of the silicon substrate 201. The upper surface of the SOI layer 203 is covered with the protective film 210, and the mirror 203a is fixed.

Figure 2J:
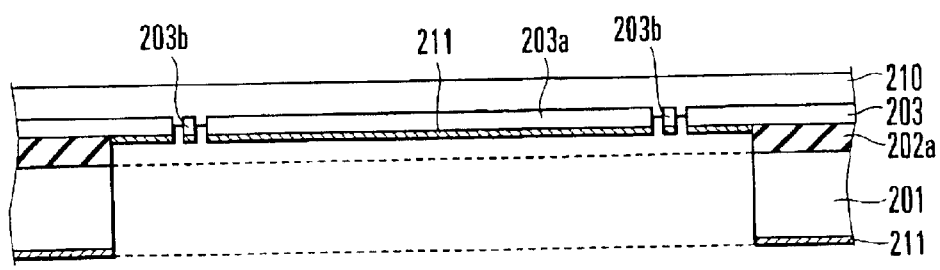
Figure 2K:
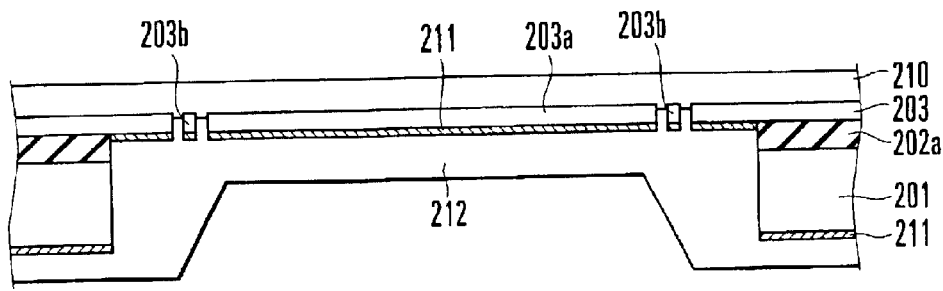

As shown in FIG. 2J, an Au/Ti metal film (reflecting metal film) 211 is formed by sputtering or vapor deposition on the lower surface of the SOI layer 203 including the mirror 203a exposed in the opening of the silicon substrate 201. The metal film 211 is comprised of a lower (SOI layer 203 side) titanium film having a film thickness of about 0.05 μm and an upper Au film having a film thickness of about 0.05 μm. The metal film 211 is also formed on the lower surface of the silicon substrate 201.

A protective film (buried protective film) 212 is formed from an organic material such as a positive photoresist material so as to cover the lower surface of the silicon substrate 201 on which the metal film 211 is formed, in addition to the formation surface of the metal film 211 which is formed on the silicon substrate 201 within the opening. Instead of the photoresist material, polyimide or a photosensitive organic resin such as polybenzoxazole may be applied to form the protective film 212.

Figure 2L:
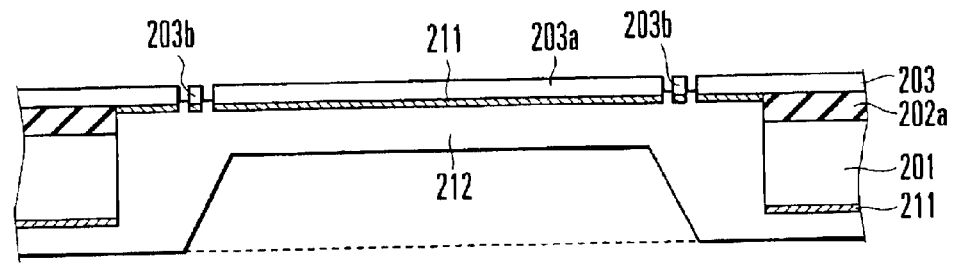

The protective film 210 on the upper surface of the SOI layer 203 is removed, exposing the upper surface of the SOI layer 203, as shown in FIG. 2L. At this time, the mirror 203a is fixed because the protective film 212 covers the lower surface of the SOI layer 203 including the mirror 203a covered with the metal film 211 on the opening side of the silicon substrate 201.

Part of the protective film 212 which is exposed on the upper surface of the SOI layer 203 at separation portions such as the torsion bar springs 203b is removed, forming gaps (grooves) between the torsion bar springs 203b, and the mirror 203a and SOI layer 203 by about 8 μm in the direction of depth. The grooves are about 2 μm wide, and the open portions formed on the upper surface of the SOI layer 203 are grooves which are about 2 μm wide and 8 μm deep.

Figure 2M:
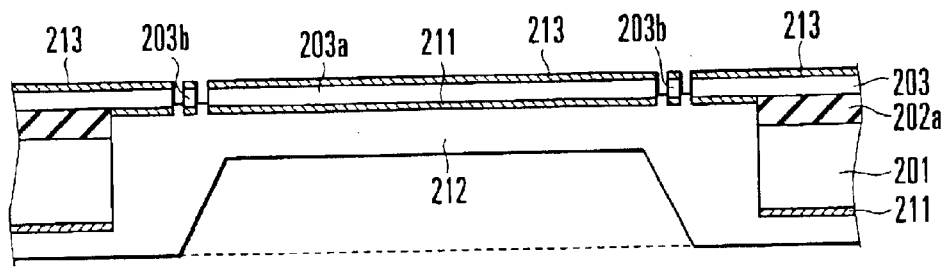
Figure 2N:
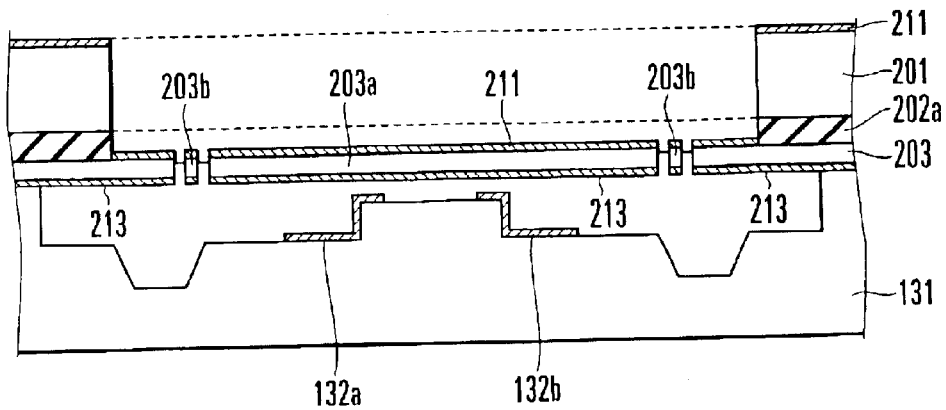

As shown in FIG. 2M, an Au/Ti metal film (connection metal film) 213 is formed by sputtering or vapor deposition on the upper surface of the SOI layer 203. The metal film 213 is comprised of a lower titanium film having a film thickness of about 0.05 μm and an upper Au film having a film thickness of about 0.05 μm.

The metal film 211 formed on the lower surface of the SOI layer 203 compensates for or increases the reflectance of the mirror 203a. The metal film 213 formed on the upper surface of the SOI layer 203 functions as a conductive metal film for electrically connecting at a low resistance the mirror substrate and the connection electrode of a mirror driving electrode substrate when the mirror substrate and the substrate having a mirror driving electrode interconnection are adhered into an optical switching device.

By processing the SOI layer 203, a plurality of mirrors 203a which are coupled by the torsion bar springs 203b are formed in a plurality of opening regions (not shown) formed in the SOI layer 203. The metal films 211 and 213 are formed on the two surfaces of the SOI layer 203.

In the dicing step, the silicon substrate 201 is diced into chips, and a mirror substrate which is diced into chips is adhered to a substrate 131, similar to the state shown in FIG. 1K.

The substrate 131 which is adhered to the mirror substrate is die-bonded to a package (not shown), and necessary terminals are wired in the wire bonding step. After the potting step, the protective film 212 which covers the mirror substrate is removed with an organic solvent such as acetone, completing packaging of the optical switching device mirror substrate having the movable mirror 203a, as shown in FIG. 2N.

The second embodiment eliminates the need for an apparatus such as a double-side aligner mechanism. According to the second embodiment, one or two surfaces of an SOI layer on which a mirror serving as a movable portion and a torsion bar spring are formed are always covered with an oxide film, protective film, or the like, and the mirror and torsion bar spring are kept fixed. According to the second embodiment, damage to the mirror and torsion bar spring during the process can be prevented, attachment of dust to the mirror surface can be suppressed, and a mirror substrate for an optical switching device serving as a micromachine can be manufactured and packaged at a high yield. The second embodiment hardly increases the number of steps.

Third Embodiment

Figure 3A:
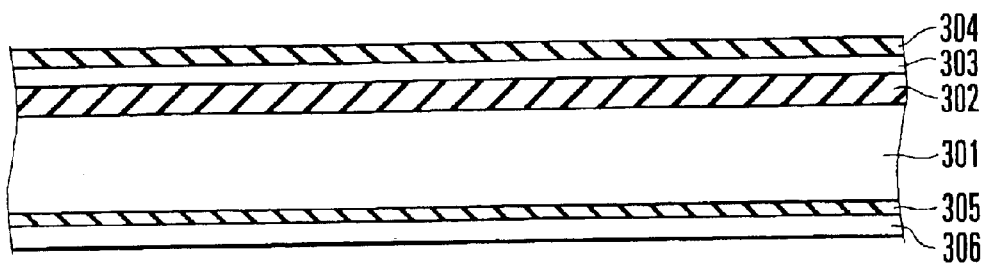
FIGS. 3A to 3O are schematic sectional views showing steps for explaining a manufacturing method according to the third embodiment of the present invention.

The third embodiment of the present invention will be described. FIGS. 3A to 3O show an example of a manufacturing method according to the third embodiment.

As shown in FIG. 3A, an SOI substrate obtained by forming a 1-μm thick buried silicon oxide 302 and a 10-μm thick single-crystal silicon layer (SOI layer) 303 on a silicon substrate 301 having a (100) plane is prepared.

The exposed surfaces of the SOI layer 303 and silicon substrate 301 are oxidized to form 1-μm thick silicon oxide films 304 and 305. In addition, a protective film (first protective film) 306 is formed from a resin such as polybenzoxazole on the exposed surface of the silicon oxide film 305. The protective film 306 may be made of polyimide or a positive photoresist. The protective film 306 is formed by applying either material.

Figure 3B:
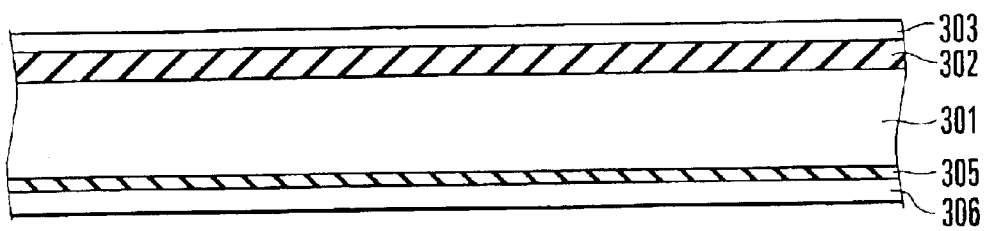

As shown in FIG. 3B, the silicon oxide film 304 is dissolved away in a buffered hydrofluoric acid solution. At this time, the silicon oxide film 305 is not removed because the protective film 306 is formed.

Figure 3C:
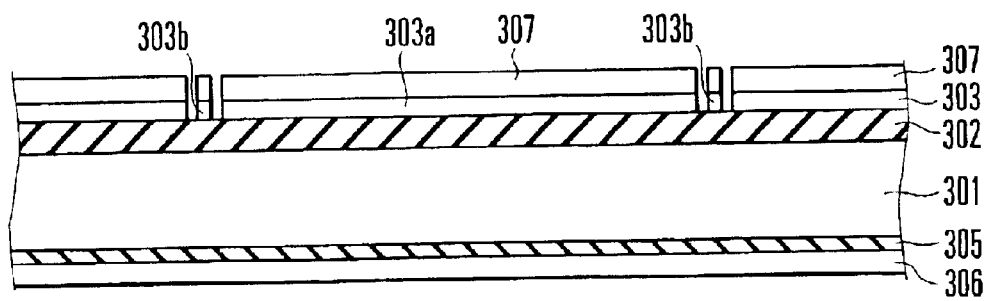

As shown in FIG. 3C, a mask pattern (movable portion formation mask pattern) 307 is formed on the SOI layer 303, as shown in FIG. 3C. The SOI layer 303 is etched using the mask pattern 307 as a mask. This etching is anisotropic etching such as reactive ion etching, and the upper surface of the buried oxide 302 is exposed at etching portions. By etching, a mirror 303a, and torsion bar springs (coupling portions) 303b simply shown in FIG. 3C are formed.

At this time, a pattern for forming a scribe line serving as a guide in dicing is formed in a region (not shown) of the mask pattern 307. A scribe line is simultaneously formed in a region (not shown) of the SOI layer 303.

According to the third embodiment, the pattern of the torsion bar spring 303b or the like is formed while the SOI substrate is free from any damage without forming any opening in the silicon substrate 301.

Figure 3D:
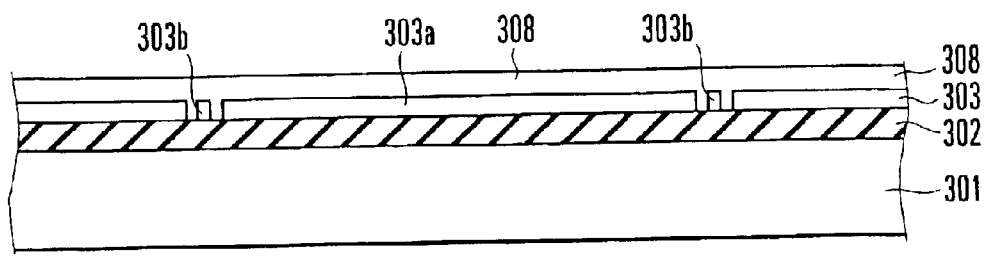

The mask pattern 307 is ashed away, and then a protective film (movable portion protective film) 308 is formed from an organic material so as to cover the SOI layer 303 having the mirror 303a and torsion bar springs 303b, as shown in FIG. 3D. The protective film 308 suffices to be made of a positive photoresist material, polyimide, or a photosensitive organic resin such as polybenzoxazole.

The protective film 306 is ashed away, and the silicon oxide film 305 is dissolved away in a buffered hydrofluoric acid solution. As a result, a surface of the silicon substrate 301 on which the buried oxide 302 is not formed, i.e., the lower surface of the SOI substrate is exposed.

Figure 3E:
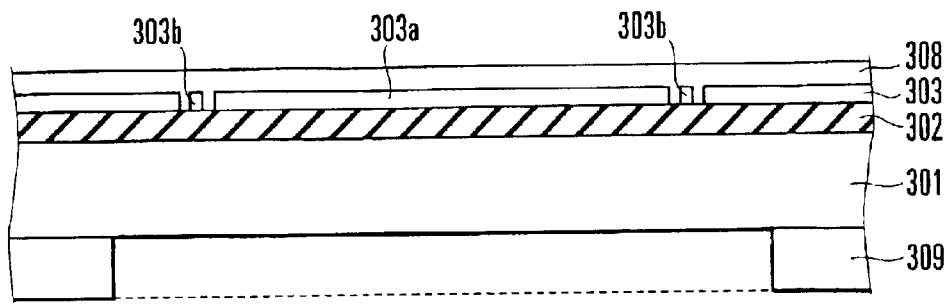
Figure 3F:
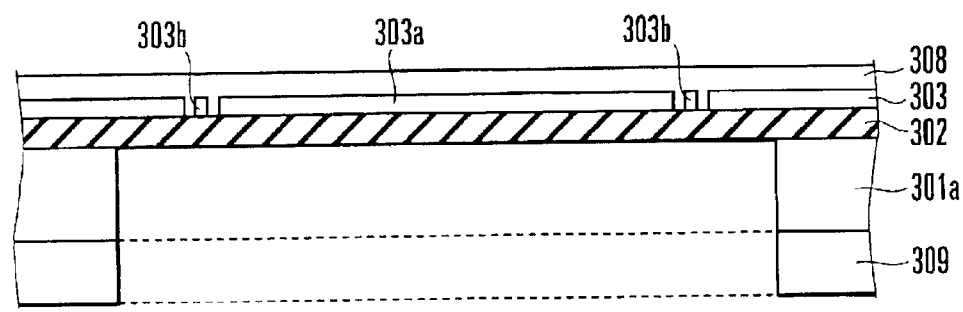
Figure 3G:
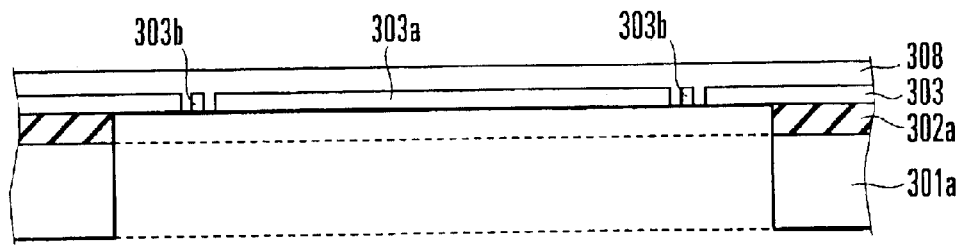

As shown in FIG. 3E, a mask pattern (frame formation mask pattern) 309 having, e.g., a square opening when viewed from the top is formed on the lower surface of the silicon substrate 301 below the region where the mirror 303a is formed. When a plurality of optical switching elements are to be manufactured simultaneously, the mask pattern 309 is a pattern corresponding to the pixel of each optical switching element, and has an open square region for each mirror. FIGS. 3A to 3O show only part of the region on the silicon substrate 301, and illustrate the square region of one pixel.

The silicon substrate 301 is etched by anisotropic etching using the mask pattern 309 as a mask until the buried oxide 302 is exposed. Accordingly, as shown in FIG. 3F, a silicon substrate 301a having a substrate opening is formed on a surface of the buried oxide 302 opposite to the SOI layer 303. In etching processing, the SOI layer 303 having the mirror 303a and the like is not etched and is protected because the protective film 308 is formed, as described above.

The mask pattern 309 is ashed away, and the buried oxide 302 which is exposed in the opening region of the silicon substrate 301 is etched away with a buffered hydrofluoric acid solution. As a result, as shown in FIG. 3G, a buried oxide 302a having a movable portion opening is formed between the silicon substrate 301a having the substrate opening and the SOI layer 303.

After that, part of the protective film 308 which is exposed in the substrate opening of the silicon substrate 301a is removed from gaps (grooves) at the torsion bar springs 303b, forming grooves between the torsion bar springs 303b, and the mirror 303a and SOI layer 303 by about 8 μm in the direction of depth. The grooves are about 2 μm wide, and the formed open portions are grooves which are about 2 μm wide and 8 μm deep. At this time, the lower surface of the SOI layer 303 is exposed in the movable portion opening of the buried oxide 302a. The upper surface of the SOI layer 303 is covered with the protective film 308, and the mirror 303a is fixed.

Figure 3H:
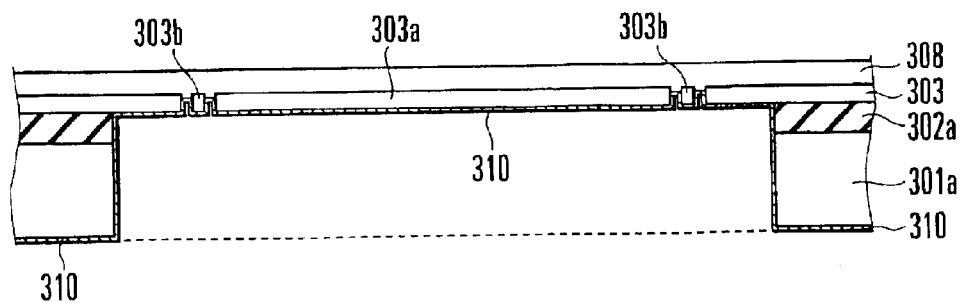

As shown in FIG. 3H, an Au/Ti metal film (reflecting metal film) 310 is formed by sputtering or vapor deposition on the exposed surface of the silicon substrate 301a, the exposed surface of the buried oxide 302a, and the exposed surface of the SOI layer 303 including the mirror 303a exposed in the opening. The metal film 310 is comprised of a lower (SOI layer 303 side) titanium film having a film thickness of about 0.05 μm and an upper Au film having a film thickness of about 0.05 μm. The metal film 310 on the lower surface of the SOI layer 303 increases the reflectance of the mirror 303a.

Figure 3I:
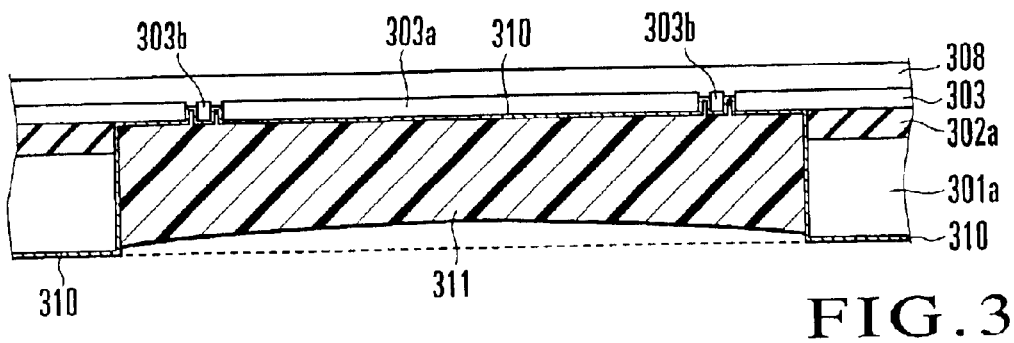

For example, a positive photoresist is applied to a surface of the silicon substrate 301a on which the buried oxide 302a is not formed. i.e., the lower surface of the SOI substrate, thereby forming a photosensitive film. Instead of a general positive photoresist, photosensitive polyimide or an organic resin such as polybenzoxazole may be adopted. The photosensitive film is patterned by known photolithography, forming a pattern in the opening of the silicon substrate 301a and buried oxide 302a. Accordingly, as shown in FIG. 3I, a protective film (buried protective film) 311 is formed.

The protective film 311 is so formed as to be buried in the opening of the silicon substrate 301a and buried oxide 302a, and does not project to the lower surface side of the SOI substrate. The portion at which the protective film 311 is formed may be recessed as far as the protective film 311 completely covers the lower surface of the SOI layer 303 which is exposed in the movable portion opening of the buried oxide 302a of the SOI layer 303. The protective film 311 may be formed by applying an organic resin to the lower surface of the SOI substrate to form an organic film, etching back the organic film, and exposing the lower surface of the SOI substrate except the opening.

Figure 3J:
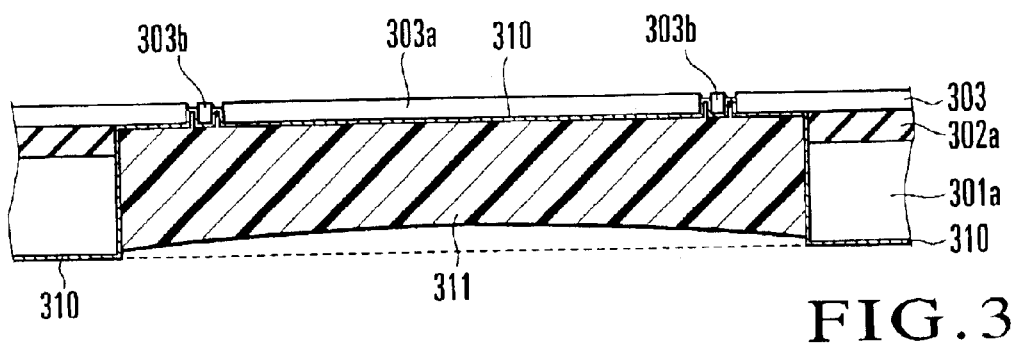

After the protective film 311 is formed in this way, the protective film 308 is removed by ashing or the like, exposing the upper surface of the SOI layer 303 (SOI substrate), as shown in FIG. 3J. At this time, the mirror 303a is fixed because the protective film 311 is formed.

Figure 3K:
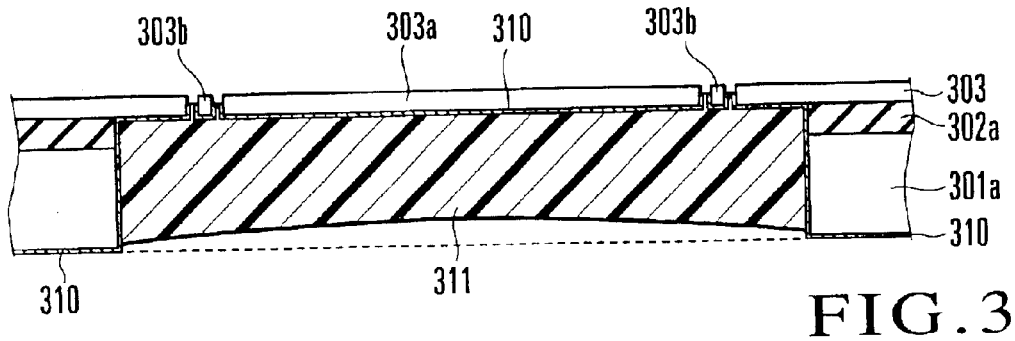

As shown in FIG. 3K, the metal film 310 exposed in the groove which is formed in the SOI layer 303 between, e.g., the mirror 303a and the torsion bar spring 303b is etched away by reverse sputtering or the like.

Figure 3L:
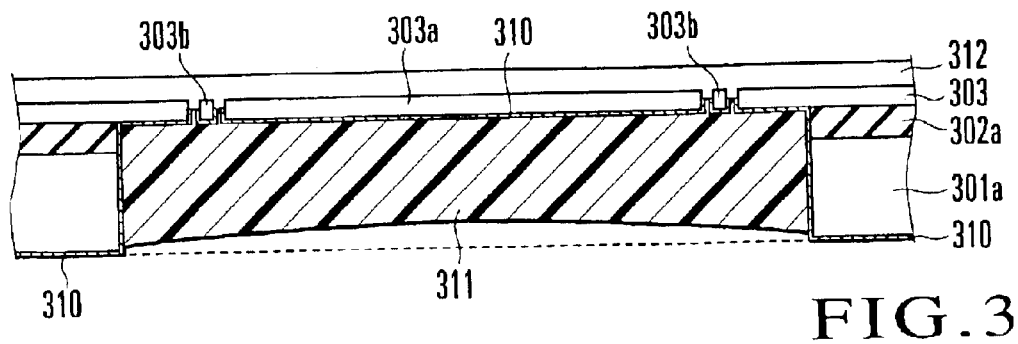

A protective film (second protective film) 312 is formed from an organic material so as to cover the SOI layer 303 on which the mirror 303a and torsion bar springs 303b are formed, as shown in FIG. 3L. The protective film 312 suffices to be made of polybenzoxazole, polyimide, or a general positive photoresist.

Figure 3M:
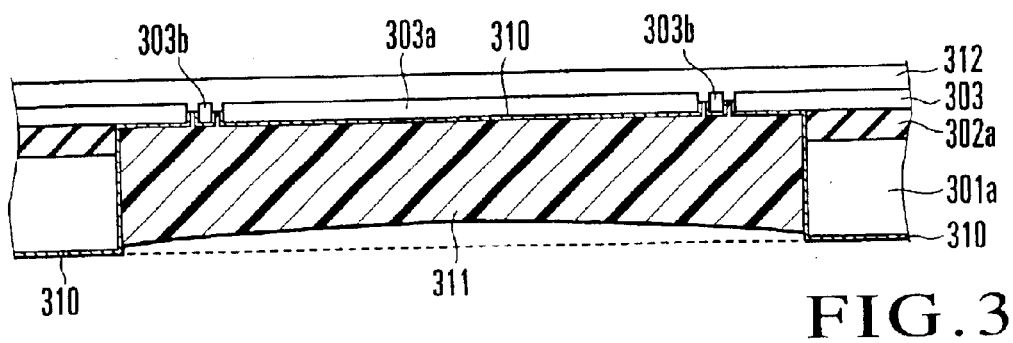

In the dicing step, the SOI substrate is diced into chip regions, forming a mirror chip 300, as shown in FIG. 3M.

Figure 3N:
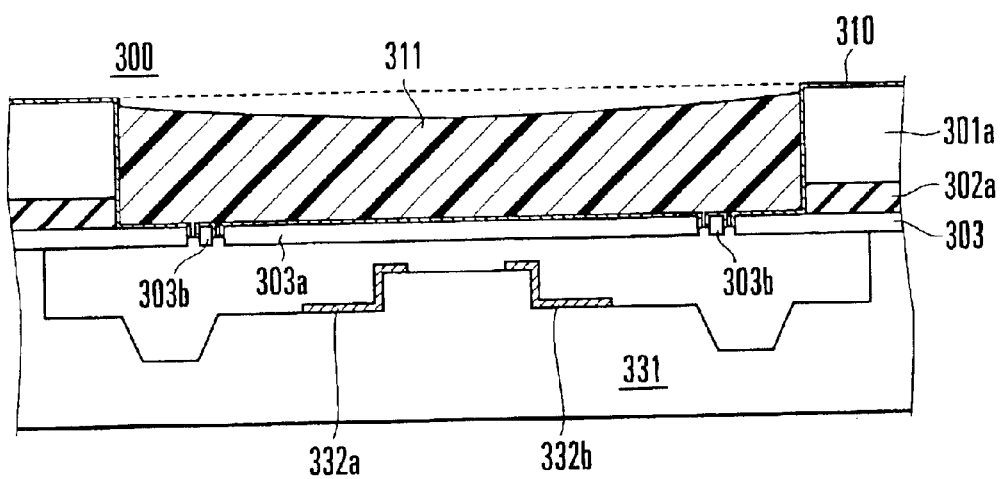
Figure 3O:
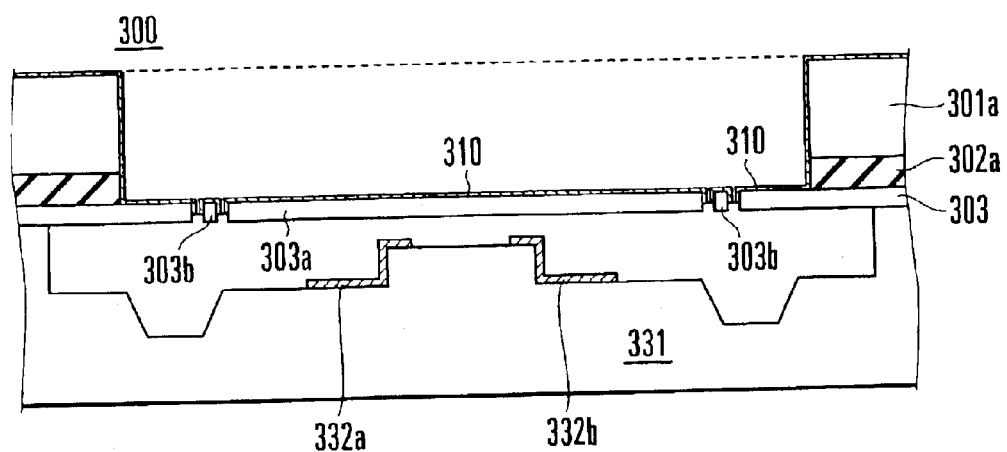
Figure 4A:
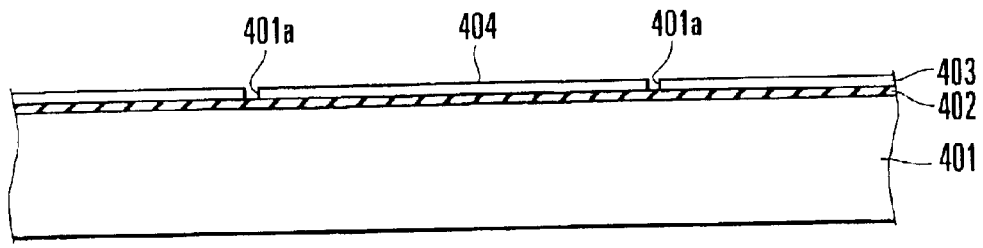
Figure 4B:
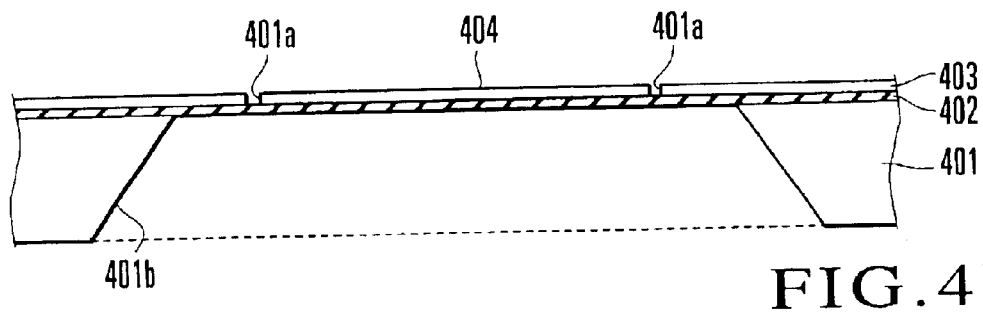
Figure 4B:
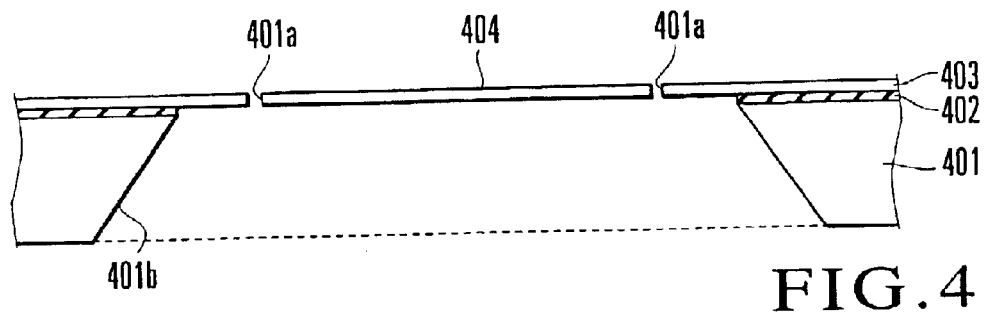
Figure 4D:
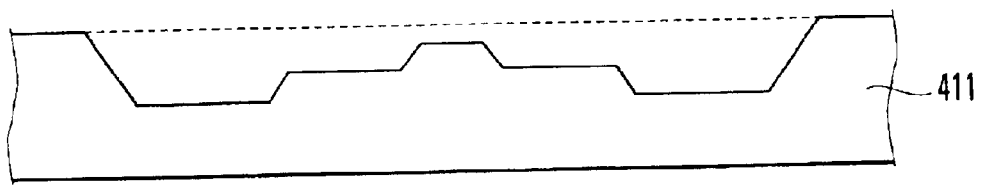
Figure 4E:
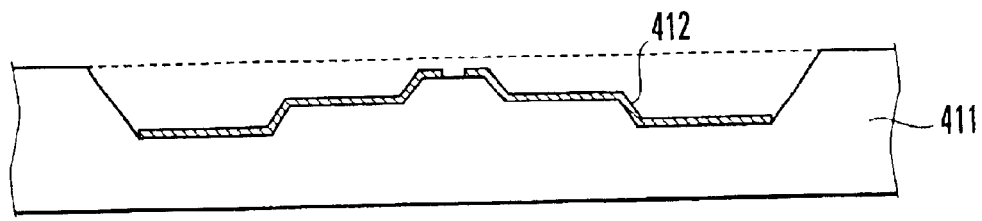
Figure 4F:
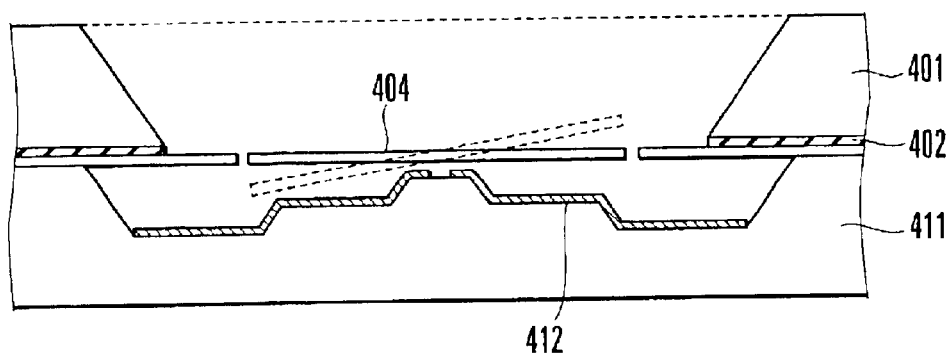
Figure 5:
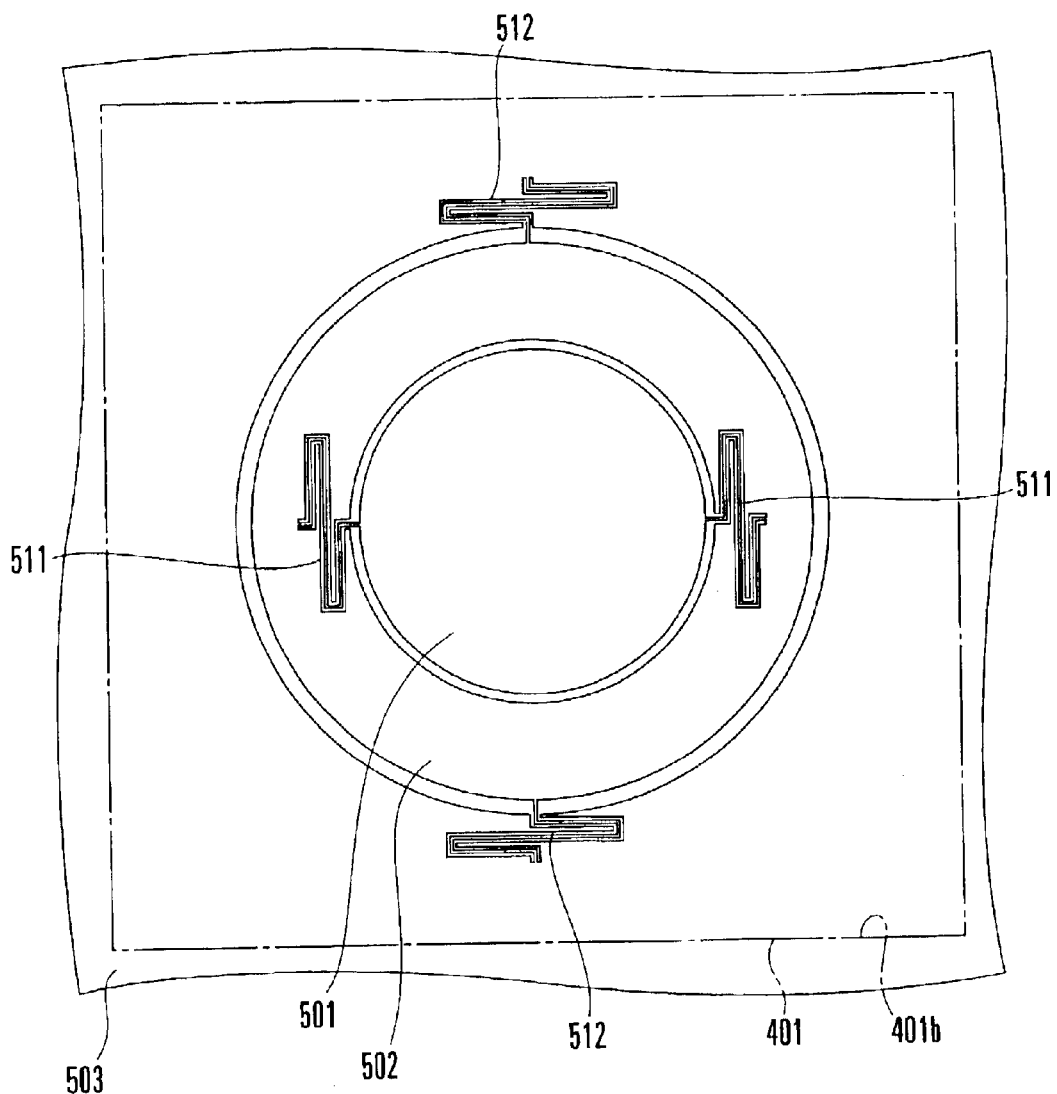
FIG. 5 is a plan view showing a state in which a mirror and mirror frame are connected by torsion bar springs.

The protective film 312 is removed, and the mirror chip 300 is adhered to a driving electrode chip 331, as shown in FIG. 3N. The driving electrode chip 331 has a mirror driving electrode interconnection, and mirror driving electrodes 332a and 332b are connected to the interconnection. In this case, the mirror chip 300 is adhered after the protective film 312 is removed. If the protective film 311 is formed thicker than the protective film 312, the protective film 312 can be easily removed. For example, the mirror chip 300 is dipped in an organic solvent in which the protective film 311 and protective film 312 are dissolved. When the protective film 312 is removed, the mirror chip 300 is extracted from the organic solvent. A state in which the protective film 311 is formed can be maintained.

The driving electrode chip 331 which is adhered to the mirror chip 300 is die-bonded to a package (not shown), and necessary terminals are wired in the wire bonding step. After the potting step, the protective film 311 which is formed on the mirror chip 300 is removed with an organic solvent such as acetone or removed by ashing or the like, completing packaging of the optical switching element having the movable mirror 303a, as shown in FIG. 3O.

As described above, in the third embodiment, a movable portion such as a mirror is covered with a protective film when the pattern of the mirror or the like is formed and a mirror chip is cut out. Also when the mirror chip is adhered, one surface of the movable portion such as the mirror is covered with a protective film. According to the third embodiment, the movable portion such as the mirror is covered with the protective film and fixed in a step of cutting into a chip or adhering a chip.

According to the third embodiment, damage to the movable portion such as the mirror or torsion bar spring during the process can be prevented. The protective film 311 can suppress attachment of dust to the reflecting surface of the mirror 303a, and an optical switching element serving as a micromachine can be manufactured and packaged at a high yield. The third embodiment hardly increases the number of steps.

Note that an optical switch having a pivotal mirror has been exemplified as a micromachine, but an application of the present invention is not limited to this. For example, the present invention can be applied to a micromachine in which a movable portion coupled at a coupling portion moves along the plane of an SOI layer.

As has been described above, in the micromachine manufacturing method of the present invention, a movable portion formed in a single-crystal silicon layer is kept fixed by bringing some layer or film into contact with the movable portion until a buried protective film is formed.

According to the present invention, a micromachine having a movable portion such as a mirror can be manufactured at a high nondefective yield.

What is claimed is:

1. A micromachine manufacturing method comprising at least:

the step of preparing a silicon substrate having a single-crystal silicon layer on an upper surface via a buried oxide;

the movable portion formation step of selectively etching the single-crystal silicon layer by using a movable portion formation mask pattern as a mask, thereby forming on the single-crystal silicon layer a movable portion which is coupled to the surrounding single-crystal silicon layer via a coupling portion on the buried oxide;

the frame formation step of selectively etching away the silicon substrate from a lower surface by using as a mask a frame formation mask pattern having an opening, thereby forming a substrate opening in the silicon substrate and exposing a lower surface of the buried oxide in the substrate opening;

the movable portion protective film formation step of forming a movable portion protective film on the single-crystal silicon layer so as to cover the movable portion while the movable portion is formed on the buried oxide;

the buried oxide processing step of forming in a movable portion formation region of the buried oxide a movable portion opening which communicates with the substrate opening while the movable portion protective film is formed; and the step of forming a buried protective film which covers the movable portion exposed in the substrate opening and the movable portion opening, and the single-crystal silicon layer around the movable portion while the movable portion protective film is formed.

2. A method according to claim 1, further comprising at least:

the cutout step of cutting out a region including the substrate opening where the movable portion is formed, thereby forming a movable portion substrate while the buried protective film is formed;

the adhesion step of adhering an electrode substrate having a movable portion driving electrode prepared in advance, and the movable portion substrate on an upper surface side of the single-crystal silicon layer so as to make the movable portion and the movable portion driving electrode face each other at a predetermined distance; and the step of removing the buried protective film after the electrode substrate and the movable portion substrate are adhered.

3. A method according to claim 1, wherein the movable portion formation step is performed after the frame formation step is performed.

4. A method according to claim 1, wherein the frame formation step is performed while an upper surface of the single-crystal silicon layer is covered with a surface protective film.

5. A method according to claim 1, wherein the frame formation step is performed after the movable portion formation step is performed.

6. A method according to claim 1, wherein the buried protective film is formed only in the substrate opening and the movable portion opening.

7. A method according to claim 1, wherein after the movable portion opening is formed, a reflecting metal film is formed on a lower surface of the movable portion that is exposed in the movable portion opening.

8. A method according to claim 1, wherein after the buried protective film is formed, the movable portion protective film is removed, and a connection metal film is formed on an upper surface of the single-crystal silicon layer.

9. A method according to claim 1, wherein the movable portion includes a mirror having a reflecting surface.

10. A method according to claim 9, further comprising:
the first step of preparing the silicon substrate having the single-crystal silicon layer on the upper surface via the buried oxide;
the second step of forming a protective film from an organic material on the single-crystal silicon layer;
the third step of forming the frame formation mask pattern having the opening on a lower surface of the silicon substrate;
the fourth step of selectively etching away the silicon substrate by using the frame formation mask pattern as a mask, thereby forming the substrate opening in the silicon substrate and exposing the lower surface of the buried oxide in the substrate opening;
the fifth step of removing the frame formation mask pattern and the protective film;
the sixth step of forming the movable portion formation mask pattern on the single-crystal silicon layer;
the seventh step of selectively etching the single-crystal silicon layer up to the buried oxide by using the movable portion formation mask pattern as a mask, thereby forming, in a region above the substrate opening of the silicon substrate, an opening and the mirror which is coupled to the surrounding single-crystal silicon layer via the coupling portion within the opening;
the eighth step of removing the movable portion formation mask pattern, and forming from an organic material the movable portion protective film which covers the single-crystal silicon layer having the mirror and the coupling portion;
the ninth step of, while the movable portion protective film is formed, selectively removing a portion of the buried oxide that is exposed in the substrate opening, thereby forming the movable portion opening and exposing a lower surface of part of the single-crystal silicon layer, a lower surface of the mirror, and a lower surface of the coupling portion;
the 10th step of forming a reflecting metal film on the lower surface of part of the single-crystal silicon layer, the lower surface of the mirror, and the lower surface of the coupling portion that are exposed in the substrate opening and the movable portion opening:
the 11th step of forming the buried protective film on the lower surface of the silicon substrate including an interior of the substrate opening; and the 12th step of, while the buried protective film is formed, removing the movable portion protective film, and then forming a connection metal film on an upper surface of the single-crystal silicon layer, an upper surface of the mirror, and an upper surface of the coupling portion.

11. A method according to claim 9, further comprising:
the first step of preparing the silicon substrate having the single-crystal silicon layer on the upper surface via the buried oxide;
the second step of forming first and second insulating films on an upper surface of the single-crystal silicon layer and a lower surface of the silicon substrate;
the third step of forming a protective film from an organic material on the first insulating film;
the fourth step of forming the frame formation mask pattern having the opening on the lower surface of the silicon substrate so as to sandwich the second insulating film;
the fifth step of selectively etching away the second insulating film and the silicon substrate by using the frame formation mask pattern as a mask, thereby forming a through opening in the second insulating film and an opening in the silicon substrate while leaving part of the silicon substrate;
the sixth step of removing the frame formation mask pattern and the protective film;
the seventh step of removing the part of the silicon substrate left in the opening of the silicon substrate by using as a mask the second insulating film having the opening, thereby exposing the lower surface of the buried oxide and forming the substrate opening;
the eighth step of forming a lower surface protective film which covers the substrate opening, the lower surface of the buried oxide exposed at a bottom of the substrate opening, and the second insulating film;
the ninth step of removing the first insulating film to expose the upper surface of the single-crystal silicon layer;
the 10th step of removing the lower surface protective film, and then forming the movable portion formation mask pattern on the single-crystal silicon layer:
the 11th step of selectively etching the single-crystal silicon layer up to the buried oxide by using the movable portion formation mask pattern as a mask, and forming, in a region above the substrate opening, a substrate opening and the mirror which is coupled to the surrounding single-crystal silicon layer via the coupling portion within the substrate opening;
the 12th step of removing the movable portion formation mask pattern, and then forming from an organic material the movable portion protective film which covers the single-crystal silicon layer having the mirror and the coupling portion:
the 13th step of, while the movable portion protective film is formed, selectively removing a portion of the buried oxide that is exposed in the substrate opening, thereby forming the movable portion opening and exposing a lower surface of part of the single-crystal silicon layer, a lower surface of the mirror, and a lower surface of the coupling portion;
the 14th step of forming a reflecting metal film on the lower surface of part of the single-crystal silicon layer, the lower surface of the mirror, and the lower surface of the coupling portion that are exposed in the substrate opening and the movable portion opening;

the 15th step of forming the buried protective film on the lower surface of the silicon substrate including the opening of the silicon substrate; and the 16th step of, while the buried protective film is formed, removing the movable portion protective film, and then forming a connection metal film on an upper surface of the single-crystal silicon layer, an upper surface of the mirror, and an upper surface of the coupling portion.

12. A method according to claim 9, further comprising:

the first step of preparing the silicon substrate having the single-crystal silicon layer on the upper surface via the buried oxide;

the second step of oxidizing an exposed upper surface of the single-crystal silicon layer and an exposed lower surface of the silicon substrate to form first and second oxide films;

the third step of forming a first protective film from an organic material on an exposed surface of the second oxide film;

the fourth step of removing the first oxide film to expose the upper surface of the single-crystal silicon layer;

the fifth step of forming the movable portion formation mask pattern on the upper surface of the single-crystal silicon layer;

the sixth step of selectively etching the single-crystal silicon layer up to the buried oxide by using the movable portion formation mask pattern as a mask, thereby forming the mirror which is movably supported via the coupling portion;

the seventh step of removing the movable portion formation mask pattern, and then forming from an organic material the movable portion protective film which covers the upper surface of the single-crystal silicon layer including the mirror;

the eighth step of removing the first protective film and the second oxide film;

the ninth step of forming on the lower surface of the silicon substrate the frame formation mask pattern having the opening in a region where the mirror is formed;

the 10th step of selectively etching the silicon substrate by using the frame formation mask pattern as a mask, thereby forming the substrate opening from which the buried oxide is exposed:

the 11th step of removing the frame formation mask pattern, then selectively etching the buried oxide exposed in the substrate opening, and forming in the buried oxide the movable portion opening from which the mirror and part of the single-crystal silicon layer around the mirror are exposed in a frame shape;

the 12th step of forming a reflecting metal film on the lower surface of the silicon substrate having the substrate opening and the lower surface of the single-crystal silicon layer which is exposed in the movable portion opening;

the 13th step of forming from an organic material the buried protective film which is arranged only inside the substrate opening and covers surfaces of the mirror and the single-crystal silicon layer that are exposed in the movable portion opening; and the 14th step of removing the movable portion protective film, and then selectively etching away the reflecting metal film which is exposed in a groove between the mirror and the single-crystal silicon layer around the mirror; and the 15th step of forming from an organic material a second protective film which covers the upper surface of the single-crystal silicon layer including the mirror.

13. A method according to claim 12, wherein the buried protective film is formed thicker than the second protective film.

* * * * *